United States Patent [19]

Howell

[11] Patent Number: 4,687,950
[45] Date of Patent: Aug. 18, 1987

[54] THYRISTOR COMMUTATION CIRCUIT

[75] Inventor: Edward K. Howell, Simsbury, Conn.

[73] Assignee: General Electric Company, New York, N.Y.

[21] Appl. No.: 839,400

[22] Filed: Mar. 14, 1986

[51] Int. Cl.$^4$ .............................................. H03K 17/72
[52] U.S. Cl. .................................... 307/642; 307/305; 307/633
[58] Field of Search ........... 307/252 C, 252 J, 252 M, 307/305

[56] References Cited

U.S. PATENT DOCUMENTS

| | | | |
|---|---|---|---|
| 3,614,474 | 10/1971 | Hahn ................................. | 307/252 C |
| 4,160,920 | 7/1979 | Courier de Méré ........... | 307/252 C |
| 4,392,175 | 7/1973 | Takigami et al. ................ | 307/252 C |
| 4,581,542 | 4/1986 | Steigerwald ..................... | 307/252 C |

FOREIGN PATENT DOCUMENTS 565393  8/1977  U.S.S.R. .......................... 307/252 M

Primary Examiner—John Zazworsky
Attorney, Agent, or Firm—Richard A. Menelly; Walter C. Bernkopf; Fred Jacob

[57] ABSTRACT

A commutating circuit in combination with a snubber circuit are employed to switch a thyristor from a conducting state to a non-conducting state. The snubber circuit is connected across the cathode and anode of the thyristor to absorb system energy when the thyristor is switched. The commutating circuit is coupled in series with the cathode of the thyristor by means of a current transformer for increasing the cathode resistance, causing the cathode current to immediately transfer to the gate.

8 Claims, 2 Drawing Figures

THYRISTOR COMMUTATION CIRCUIT

BACKGROUND OF THE INVENTION

When in a conducting state, thyristors remain in that state until the anode current drops below the holding current of the thyristor, at which point the thyristor commutates to the non-conducting or OFF state. One prior commutation technique employs the normal reversal of an AC current. Other known techniques include the discharge of a commutating capacitor into the thyristor to force the current to zero and the increase of the holding current of the thyristor by forcing a reverse gate current, as in the gate turn-off (GTO) thyristor. One method of reversing gate current in the GTO is called "emitter switching" or "cathode switching" and employs a switching device such as a mechanical switch or a transistor switch in series with the cathode of the GTO and a pair of diodes to conduct gate current around the switch when the switch turns off. The switch, in the ON state, must conduct the full GTO current and, in the OFF state, must support a relatively low voltage, typically in the order of 20 volts. The switch voltage drop in the ON state must be very low, on the order of 100 millivolts, in order to minimize energy loss. The purpose of this invention is to describe a thyristor commutation circuit with extremely low energy loss that is operated by means of a commutation circuit that is isolated from the thyristor circuit.

SUMMARY OF THE INVENTION

A commutating circuit is connected in series with a thyristor that is conducting to rapidly switch the thyristor to a non-conducting state. A snubber circuit is connected across the thyristor to absorb system energy to prevent the thyristor from becoming damaged during the switching operation.

DESCRIPTION OF THE PREFERRED EMBODIMENT

Figure 1:
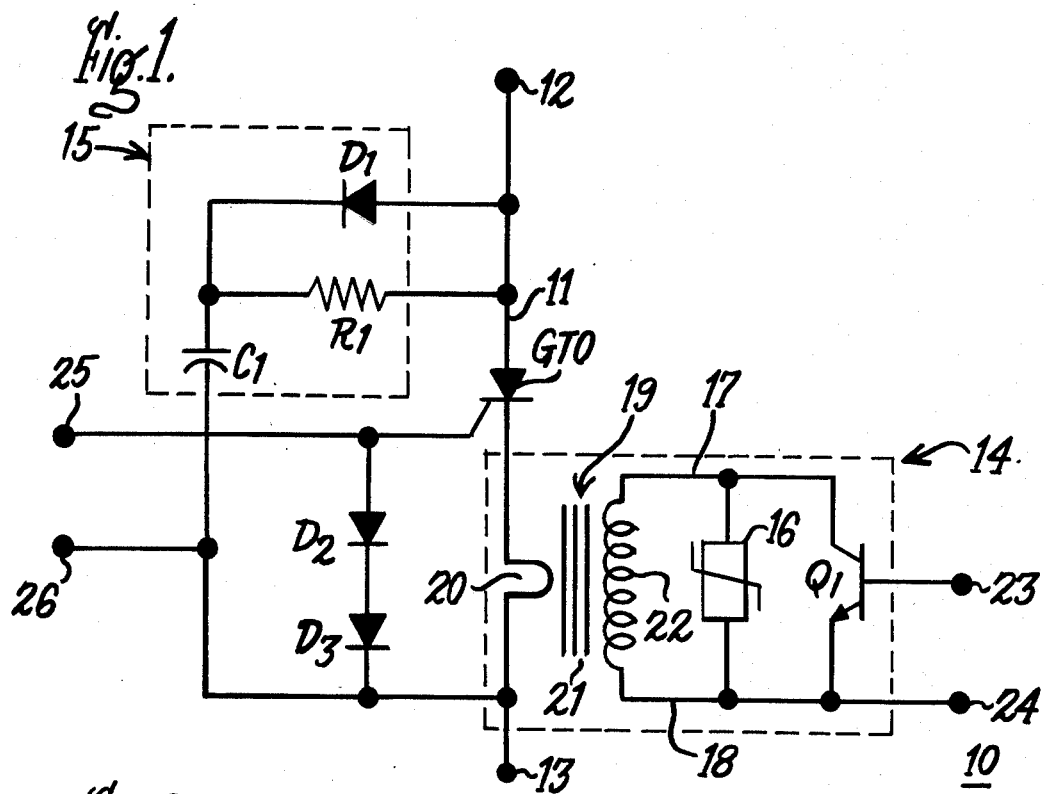
FIG. 1 is a schematic representation of a thyristor switching circuit according to the invention for a GTO.

A thyristor circuit 10 is depicted in FIG. 1, wherein a gate turn-off device GTO is connected in series within a conductor 11 with a voltage imposed across terminals 12, 13 at opposite ends of the conductor. A commutating circuit 14 is connected in series with the GTO and a snubber circuit 15 is connected across the GTO to assist in the commutation and to protect the GTO from damage once the GTO transfers from its conducting to its non-conducting state. The commutating circuit is coupled with the GTO by means of a current transformer 19, as indicated. The current transformer primary winding 20, which is a single turn, couples the commutating circuit with the thyristor circuit by means of the transformer core 21 and secondary winding 22. A varistor 16 is connected across the secondary winding and a transistor $Q_1$ is, in turn, connected across conductors 17, 18 and the varistor. In operation, transistor $Q_1$ is turned on by imposing base drive across terminals 23, 24, which, in turn, effectively shorts the secondary winding 22 so that no voltage appears across the varistor. To turn on the GTO, a pulse is applied over terminals 25, 26 to the gate of the GTO which is connected to the cathode through diodes $D_2$, $D_3$. When the GTO is conducting and with base drive applied to the transistor $Q_1$, no current flows through the diodes $D_2$, $D_3$. When base drive is removed from transistor $Q_1$, voltage is generated across the secondary winding 22 by transformer action of core 21. The voltage simultaneously increases across varistor 16, reaching the varistor clamping voltage, at which time the varistor becomes conductive and a voltage is reflected across primary winding 20. The voltage across the primary winding represents an impedance in series with the GTO, causing the GTO cathode current to transfer to the gate and diodes $D_2$, $D_3$ rapidly switching the GTO to the OFF state. The circuit current transfers through diode $D_1$, and resistor $R_1$, within the snubber circuit 15, causing capacitor $C_1$ to start charging thereby limiting the rate-of-change of voltage across the GTO. When it is desired to switch the GTO back to its conducting state, base drive is applied to $Q_1$ to turn on $Q_1$ and a current pulse is applied across the cathode and gate of the GTO via terminals 25, 26 to turn on the GTO.

Figure 2:
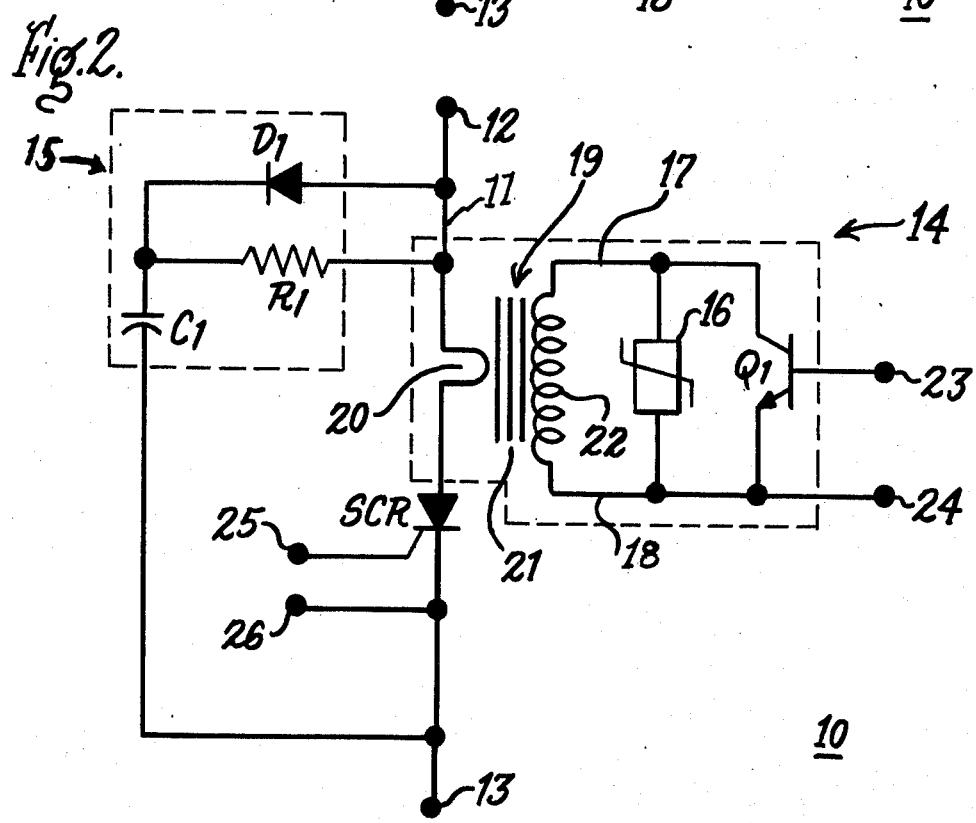
FIG. 2 is a schematic representation of a thyristor switching circuit according to the invention for an SCR.

An SCR is depicted within the thyristor circuit 10 of FIG. 2, connected in series within conductor 11 with a voltage applied across terminals 12, 13. The commutating circuit 14 is connected in series with the anode of the SCR and the snubber circuit 15 is connected across the SCR in a manner similar to the circuit of FIG. 1. Base drive is applied to $Q_1$ by means of terminals 23, 24 to prevent the voltage from building up across the secondary winding 22 of current transformer 19 as well as across the varistor 16. The commutating circuit 14 can also be connected in series with the cathode of the SCR such as with the GTO shown in the circuit of FIG. 1, if so desired. The SCR is turned on by a current pulse to terminals 25, 26 across the gate and cathode of the SCR. To turn off the SCR, the base drive to $Q_1$ is discontinued causing the occurrence of an impedance in series with the SCR, driving the circuit current through the snubber circuit 15 via diode $D_1$, and resistor $R_1$, to capacitor $C_1$, as described earlier.

It has therefore been shown that turn-off of thyristor devices can be achieved by means of a commutating circuit and a snubber circuit. The presence or absence of base drive to the transistor connected within the commutation circuit effectively controls the switching state of the thyristors.

Having thus described my invention, what I claim as new and desire to secure by Letters Patent is:

1. A thyristor switch circuit comprising:
   (a) a thyristor having anode, cathode and gate electrodes, said anode and cathode electrodes being connected in a power circuit with a source of potential;
   (b) a commutation circuit for increasing the impedance of said power circuit and causing thyristor current to transfer to said gate electrode and terminating conduction between said cathode and anode electrodes;
   (c) said commutation circuit comprising a current transformer having a primary and a secondary winding and a transistor having primary electrodes and at least one control electrode;
   (d) said primary winding being connected in series circuit with said cathode electrode and said source;

(e) said secondary winding being connected in series circuit with the primary electrodes of said transistor;

(f) means for applying a signal to at least one control electrode and one of the primary electrodes of said transistor to switch said transistor and thus the thyristor between their conducting and turn off states; and (g) a snubber circuit connected in parallel with the series combination of said thyristor and the primary winding of said transformer for receiving circuit current from said thyristor when said thyristor is turned off.

2. The thyristor switching circuit of claim 1 wherein said primary winding comprises one turn and said secondary winding comprises a plurality of turns.

3. The thyristor switching circuit of claim 1 wherein said thyristor is selected from the group consisting of a gate turn-off device and a silicon-controlled rectifier.

4. The thyristor switching circuit of claim 1 wherein said commutation circuit further comprises a pair of diodes connected between said base electrode and the junction of said primary winding and of said source of potential.

5. The thyristor switching circuit of claim 1 including means connected between the gate electrode and the emitter electrode of said transistor for turning on said thyristor.

6. The thyristor switching circuit of claim 1 wherein said snubber circuit comprises a capacitor connected in series circuit with the parallel connected combination of a diode and of a resistor.

7. The thyristor switching circuit of claim 2 further comprising a varistor connected in parallel with the secondary winding of said current transformer and also with the primary electrodes of said transistor.

8. A thyristor switch circuit comprising:
(a) a thyristor having anode, cathode and gate electrodes, said anode and cathode electrodes being connected in a power circuit with a source of potential;
(b) a commutation circuit connected in series with said anode electrode and said source for increasing the impedance of said power circuit and to turn off current flow through said thyristor;
(c) a snubber circuit connected in parallel with the series combination of the anode and cathode electrodes of said thyristor and said commutation circuit for diverting circuit current from said thyristor when its impedance is increased so as to turn off said thyristor;
(d) said commutation circuit comprising a current transformer having a primary winding and a secondary winding, and a transistor having primary electrodes and at least one control electrode;
(e) said primary winding being connected in series with said anode electrode and said source;
(f) said secondary winding being connected in series circuit with the primary electrodes of said transistor; and
(g) means for applying a signal to at least one control electrode and one of the primary electrodes of said transistor to switch said transistor and thus the thyristor between their conducting and turn off states.

* * * * *